(12) United States Patent
Matsumura

(10) Patent No.: US 8,241,455 B2
(45) Date of Patent: *Aug. 14, 2012

(54) METHOD FOR PACKING ELECTRIC COMPONENTS ON A SUBSTRATE

(75) Inventor: Takashi Matsumura, Tochigi (JP)

(73) Assignee: Sony Chemical & Information Device Corporation, Tokyo (JP)

( * ) Notice: Subject to any disclaimer, the term of this patent is extended or adjusted under 35 U.S.C. 154(b) by 98 days.

This patent is subject to a terminal disclaimer.

(21) Appl. No.: 12/753,533

(22) Filed: Apr. 2, 2010

(65) Prior Publication Data

US 2010/0186894 A1 Jul. 29, 2010

Related U.S. Application Data

(60) Division of application No. 12/186,154, filed on Aug. 5, 2008, now abandoned, which is a continuation of application No. PCT/JP2007/052217, filed on Feb. 8, 2007.

(30) Foreign Application Priority Data

Feb. 10, 2006 (JP) ................. 2006-033745

(51) Int. Cl.
*B32B 37/00* (2006.01)

(52) U.S. Cl. ..................... 156/228; 156/289

(58) Field of Classification Search ............... 156/228, 156/285, 381, 382, 580, 581, 583.1, 583.3, 156/289, 306.9, 307.1
See application file for complete search history.

(56) References Cited

U.S. PATENT DOCUMENTS

| | | | |
|---|---|---|---|
| 3,557,446 A | 1/1971 | Charschan | |
| 4,111,024 A | 9/1978 | Dahlman et al. | |
| 5,707,480 A * | 1/1998 | Bezama et al. | 156/382 |
| 5,972,140 A | 10/1999 | Hass et al. | |
| 7,736,459 B2 * | 6/2010 | Matsumura | 156/289 |
| 2004/0238115 A1 | 12/2004 | Matsuno et al. | |
| 2006/0113356 A1 | 6/2006 | Matsumura et al. | |

FOREIGN PATENT DOCUMENTS

| | | |
|---|---|---|
| CN | 1554115 | 12/2004 |
| EP | 1434261 A1 | 6/2004 |
| JP | 08-088462 | 4/1996 |

(Continued)

OTHER PUBLICATIONS

Klaka et al., "Reduction of Thermomechanical Stress by applying a Low Temperature Joining Technique,", Proc. of the 6th Intl. Symposium on Power Semiconductor Devices & ICs, May 31-Jun. 2, 1994, pp. 259-264.

European Search Report dated Aug. 23, 2010 corresponding to European Patent Appln. No. 10168917.2.

(Continued)

*Primary Examiner* — James Sells
(74) *Attorney, Agent, or Firm* — K&L Gates LLP

(57) ABSTRACT

A compression bonding device capable of packaging electric components on both sides of a substrate is provided. A compression bonding device includes first and second pressing rubbers. Electric components can be simultaneously packaged on the front face and the rear face of a substrate by sandwiching the substrate between the first and second pressing rubbers. The electric components are not subjected to a force for horizontally moving them because the first and second pressing rubbers are prevented from horizontal extension by a first dam member. Thus, the electric components are connected to the substrate without misalignment, thereby obtaining a highly reliable electric device.

3 Claims, 10 Drawing Sheets

FOREIGN PATENT DOCUMENTS

| | | |
|---|---|---|
| JP | 11-354588 | 12/1999 |
| JP | 2000-079611 | 3/2000 |
| JP | 2001-145911 | 5/2001 |
| JP | 2002-359264 | 12/2002 |
| JP | 2003-086635 | 3/2003 |
| JP | 2003-2890920 | 10/2003 |
| JP | 2004-296746 | 10/2004 |
| JP | 2005-032952 | 2/2005 |

OTHER PUBLICATIONS

European Search Report dated Aug. 23, 2010 corresponding to European Patent Appln. No. 10168899.2.

Chinese Office Action dates Sep. 11, 2009, for Patent Application No. 200780004972.6.

European Search Report dated Jun. 5, 2012 for corresponding European Patent Appln. No. 07713933.

* cited by examiner

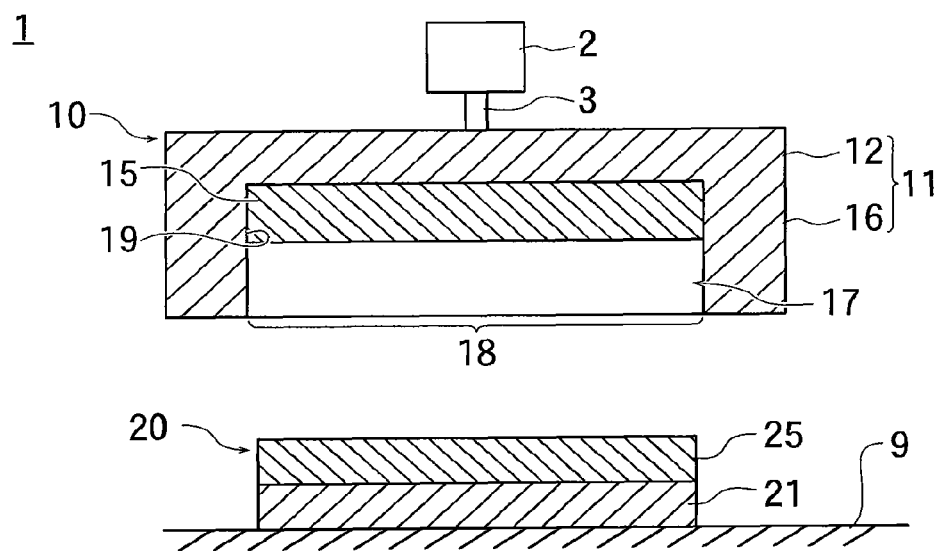
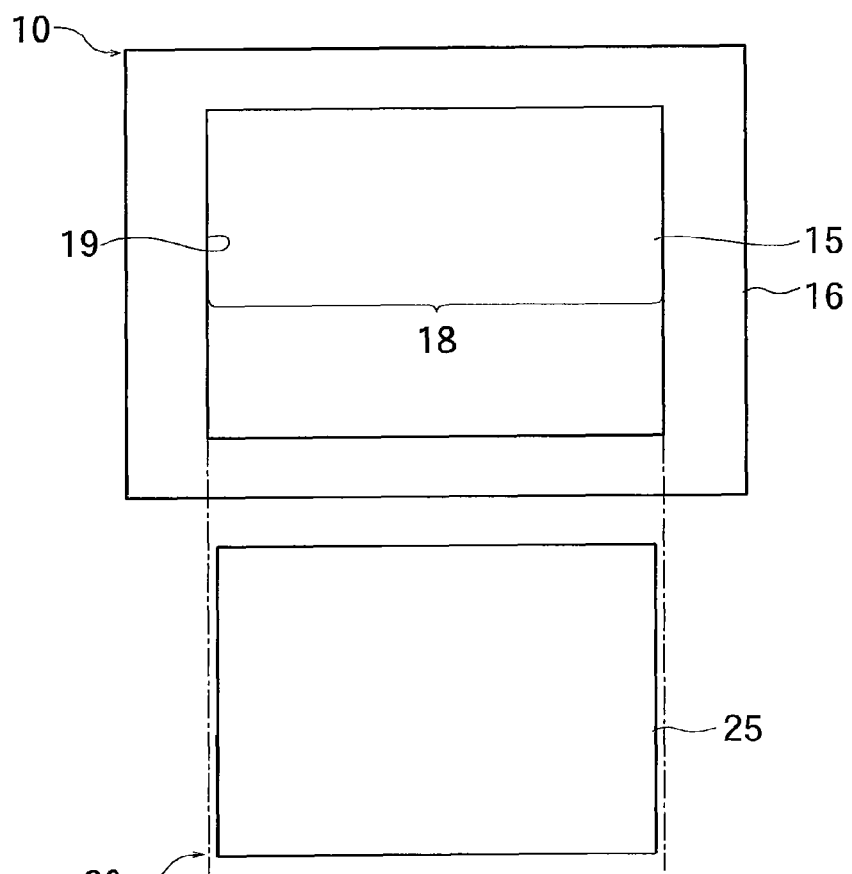
Fig. 1
Fig. 2

METHOD FOR PACKING ELECTRIC COMPONENTS ON A SUBSTRATE

CROSS REFERENCE TO RELATED APPLICATIONS

The present application is a divisional of U.S. patent application Ser. No. 12/186,154, filed on Aug. 5, 2008, now abandoned, which is a continuation of International Application No. PCT/JP2007/052217, filed on Feb. 8, 2007, which claims priority to Japan Patent Application No. 2006-033745, filed on Feb. 10, 2006, the entire disclosures of which are hereby incorporated by reference herein in their entireties.

BACKGROUND

The present disclosure generally relates to a compression bonding device for packaging electric components on a substrate.

Conventionally, packaging processes for connecting electric components such as semiconductor elements to a substrate have used a compression bonding device by which the electric components are pressed against the substrate with a pressing head under heat.

Reference numeral 101 in FIG. 14(a) represents a conventional compression bonding device. The compression bonding device 101 has a pedestal 126 and a pressing head 120.

The pressing head 120 has a pressing rubber fitted into a metal frame, or a pressing rubber bonded to a metal plate with an adhesive or a liquid rubber cast into a metal frame and cured within the metal frame, etc.

In the case of a pressing rubber 122 fitted into a head body 121 made of a metal frame, the surface of the pressing rubber 122 is flush with the surface of the head body 121 or projects below the surface of the head body 121. When the pressing head 120 is pressed against an object to be pressed 110 on the pedestal 126, the surface of the pressing rubber 122 comes into contact with the object to be pressed 110.

The object to be pressed 110 has a substrate 111 and electric components 116, 118 having different thicknesses placed on the substrate 111 so that steps are formed on the substrate 111 due to the thickness differences between the electric components 116 and 118.

The pressing rubber 122 is formed from an elastic material that deforms under pressure. The pressing rubber 122 first comes into contact with the thickest electric component 116. Then, the pressing rubber 122 deforms and successively comes into contact with the electric components in the order of thickness from the thickest 116 to thinnest 118. Finally, all of the electric components 116, 118 are pressed by the pressing rubber 122.

Before the electric components 116, 118 are pressed by the compression bonding device 101, the electric components 116, 118 and the substrate 111 are aligned; and terminals of the electric components 116, 118 are directly above terminals of the substrate 111 with an adhesive 115 inserted therebetween.

The surface of the pedestal 126 is nearly horizontal, and the substrate 111 is horizontally placed on that surface. When the pressing head 120 is vertically moved downward to press the electric components 116, 118 while the object to be pressed 110 is heated, the electric components 116, 118 thrust the adhesive 115 aside to move right below, whereby the terminals of the electric components 116, 118 and the terminals of the substrate 111 come into contact with each other to electrically connect the electric components 116, 118 and the substrate 111 (FIG. 14(b)). Thus, the conventional compression bonding device 101 can simultaneously connect electric components having different thicknesses to one substrate.

However, if the pressing rubber 122 is depressed when it presses components 116, 118, the pressing rubber 122 has the property of bulging around the depressed part. Therefore, the bulging part of the pressing rubber 122 extends over the frame of the head body 121 with the result that the surface of the pressing rubber 122 extends horizontally outward.

FIG. 15 is a plan view for showing the manner in which the surface of the pressing rubber 122 extends horizontally outward, i.e., the pressing rubber 122 radially flows around the center C of the planar shape. Due to the greater amount of movement at the periphery of the pressing rubber 122 as compared with the vicinity of the center C, the electric components 116, 118 pressed by the periphery of the pressing rubber 122 horizontally move as the pressing rubber 122 extends, whereby the terminals of the electric components 116, 118 are misaligned from the location directly above the terminals of the substrate 111.

If the electric components 116, 118 are misaligned, the terminals of the electric components 116, 118 fail to come into contact with the terminals of the substrate 111, resulting in the deterioration of a reliable connection between the electric components 116, 118 and the substrate 111.

When the electric components 116, 118 are to be packaged on not only one side of the substrate 111 but also the other side thereof, a longer time is required for packaging because the electric components 116, 118 need to be packaged on each side of the substrate 111 in twice.

Especially in a process for packaging the electric components 116, 118 on one side and then packaging the electric components 116, 118 on the other side, a pattern corresponding to the shapes of the electric components 116, 118 need to be formed on the pedestal 126 so as to protect the packaged electric components 116, 118 against damages by pressing because the side on which the electric components 116, 118 have already been packaged faces the pedestal 126.

In this method, however, the pedestal 126 must be newly prepared each time when the types of the electric components 116, 118 and the substrate 111 or the locations at which the electric components 116, 118 are to be connected are changed.

Moreover, the electric components 116, 118 can be damaged by repeatedly heating and pressing because the electric components 116, 118 packaged on one side, are heated and pressed again when the electric components 116, 118 are connected to the other side. See, Patent Document Nos. JP A 2002-359264 and JP A 2005-32952.

SUMMARY

The present embodiments are directed toward solving the problems described above, with the purpose of providing a compression bonding device capable of reliably connecting electric components and a substrate.

In an embodiment, a compression bonding device is provided including first and second pressing rubbers. The first and second pressing rubbers are configured so that an object to be pressed which is placed between the first and second pressing rubbers can be pressed by the first and second pressing rubbers. A dam member is positioned higher than a surface level of the first pressing rubber is placed around the first pressing rubber, and the second pressing rubber can be inserted into a space surrounded by the dam member.

In an embodiment, a compression bonding device is provided including first and third pressing rubbers. The first and third pressing rubbers are configured so that an object to be pressed, which is placed between the first and third pressing rubbers, can be pressed by the first and third pressing rubbers. A dam member positioned higher than a surface level of each of the first and third pressing rubbers is placed around each of the first and third pressing rubbers.

In an embodiment, the compression bonding device including the first pressing rubber which is placed on a first pressing plate, includes a first compression member, which is compressively deformable and placed between the first pressing rubber and the first pressing plate. The first dam member becomes higher than the surface level of the first pressing rubber at least when the first compression member is compressed.

In an embodiment, a compression bonding device is provided including fourth and fifth pressing rubbers. The fourth and fifth pressing rubbers are configured so that an object to be pressed, which is placed between the fourth and fifth pressing rubbers, can be pressed by the fourth and fifth pressing rubbers. The compression bonding device has a dam member surrounding the fourth and fifth pressing rubbers, and the dam member is separable from the fourth and fifth pressing rubbers.

In an embodiment of the compression bonding device, wherein the dam member is tubular, and the fourth and fifth pressing rubbers can be inserted into the tube of the dam member.

According to the embodiment defined above, both a front face and a rear face of a substrate are simultaneously pressed by sandwiching the substrate between first and second pressing rubbers, whereby electric components can be simultaneously connected to both the front face and the rear face of the substrate.

The time required for packaging processes can be shortened and electric components are less damaged by heating and pressing because the electric components can be simultaneously connected to a front face and a rear face of a substrate. Highly reliable electric devices can be obtained because the electric components horizontally move on neither the front face nor the rear face of the substrate and the electric components are not misaligned. As a result of the absence of horizontal extension of the pressing rubber when an object to be pressed is pressed, nearly the total force for deforming the pressing rubber converts into a force for pressing the object to be pressed, thereby avoiding wasted pressure when the object is pressed.

Additional features and advantages are described herein, and will be apparent from, the following Detailed Description and the figures.

BRIEF DESCRIPTION OF THE FIGURES

FIG. 1 is a sectional diagram for illustrating a compression bonding device according to a first embodiment;

FIG. 2 is a plan view for illustrating the geometry of the pressing head and the pedestal;

DETAILED DESCRIPTION

Figure 3:
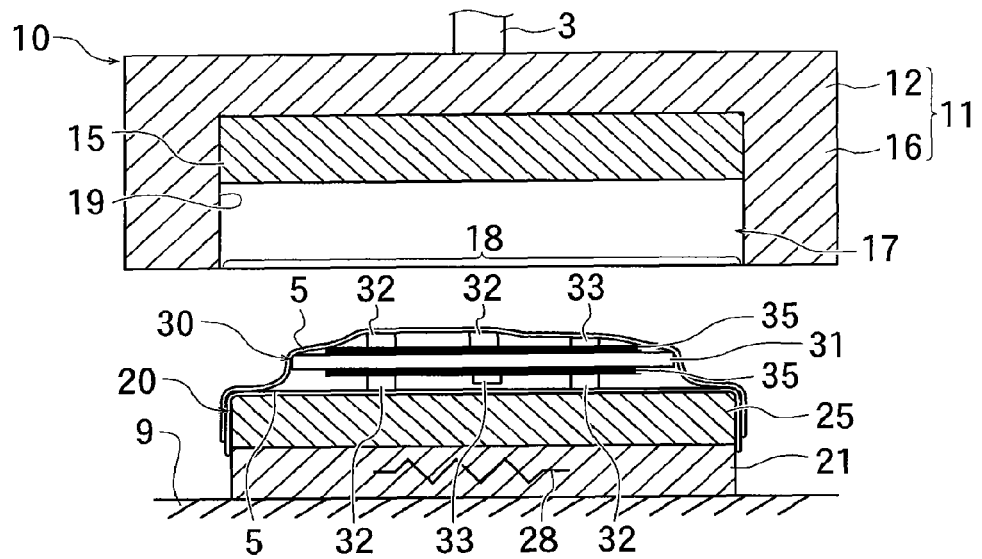
FIG. 3(a)-(c) are sectional diagrams for illustrating a process for packaging electric components on a substrate.
Figure 3:
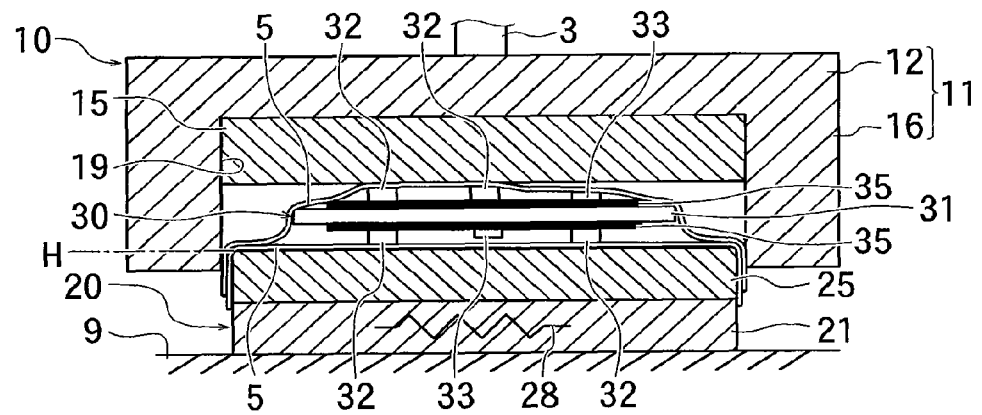
Figure 3:
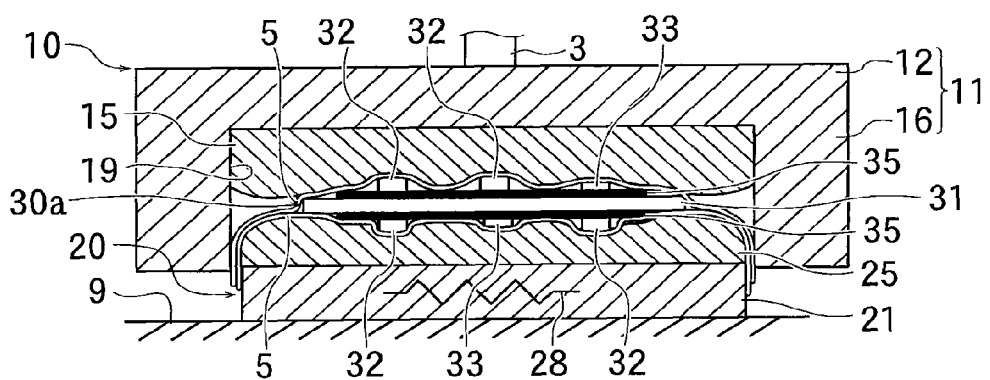

Reference numeral 1 in FIG. 1 represents a compression bonding device according to a first embodiment, and this compression bonding device 1 has first and second pressing heads 10, 20, a platform 9, and a drive unit 2. The first pressing head 10 has a metal head body 11, a hole 19 having the bottom face formed in the head body 11, and a first pressing rubber 15 placed in the hole 19.

The first pressing rubber 15 has a columnar shape in horizontal section nearly identical to the sectional shape of a part surrounded by a first dam member 16 and has a bottom face in close contact with the bottom face of the hole 19 and a side face in contact with the side wall of the hole 19.

The height of the first pressing rubber 15 from the bottom face to the surface is lower than the depth of the hole 19 and the first pressing rubber 15 is surrounded by the first dam member 16 formed by the side wall of the holes 19; and a concave 17, which has the surface of the first pressing rubber 15 as a bottom face and the first dam member 16 as a side face, is formed between the surface of the first pressing rubber 15 and the edge of the first dam member 16.

The first pressing head 10 is placed in such a manner that the surface of the first pressing rubber 15 is nearly horizontal with the opening 18 of the concave 17 facing downward.

The part of the first head body 11 in close contact with the bottom face of the first pressing rubber 15 is a first pressing plate 12, and the first pressing plate 12 is fitted to the drive unit 2 via a shaft 3. The first pressing plate 12 is configured in such a manner that when the drive unit 2 is activated and the shaft 3 is extended and retracted, the first pressing plate 12 vertically moves upward and downward together with the first pressing rubber 15 and the first dam member 16 while the surface of the first pressing rubber 15 remains nearly horizontal.

The platform 9 is placed at a position right below the first pressing head 10, and the second pressing head 20 is placed on the platform 9.

The second pressing head 20 has a second head body 21 formed from a metal pressing plate and a second pressing rubber 25 placed on the surface of the second head body 21, and the second pressing head 20 is in close contact with the platform 9 on the side of the second head body 21 while it faces upward on the side of the second pressing rubber 25.

Thus, the surface of the second pressing rubber 25 is exposed on the upper face of the second pressing head 20.

Here, nothing is placed around the second pressing rubber 25, and the planar shape of the second pressing rubber 25 is a similar figure which is identical to or smaller than the aforementioned opening 18 of the concave 17 (FIG. 2) and at least the upper end of the second pressing rubber 25 of the second pressing head 20 can be inserted into the concave 17.

Next, an object to be pressed that can be pressure-bonded using this compression bonding device 1 and a process for pressure-bonding the object to be pressed 30 are explained.

Figure 4:
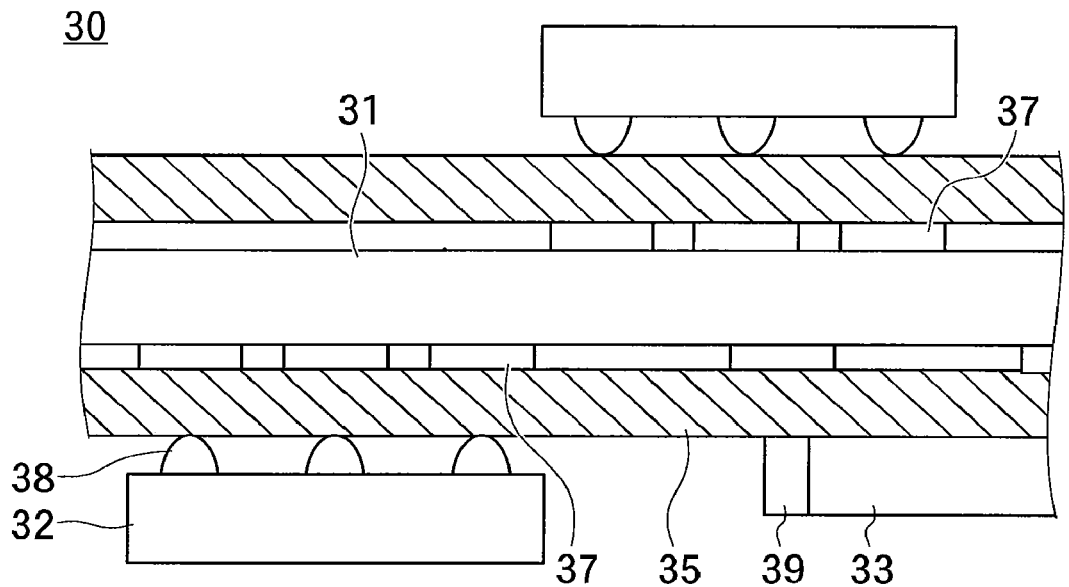
FIG. 4(a) and (b) are enlarged sectional diagrams for illustrating a process by which the electric components are connected to the substrate.
Figure 4:
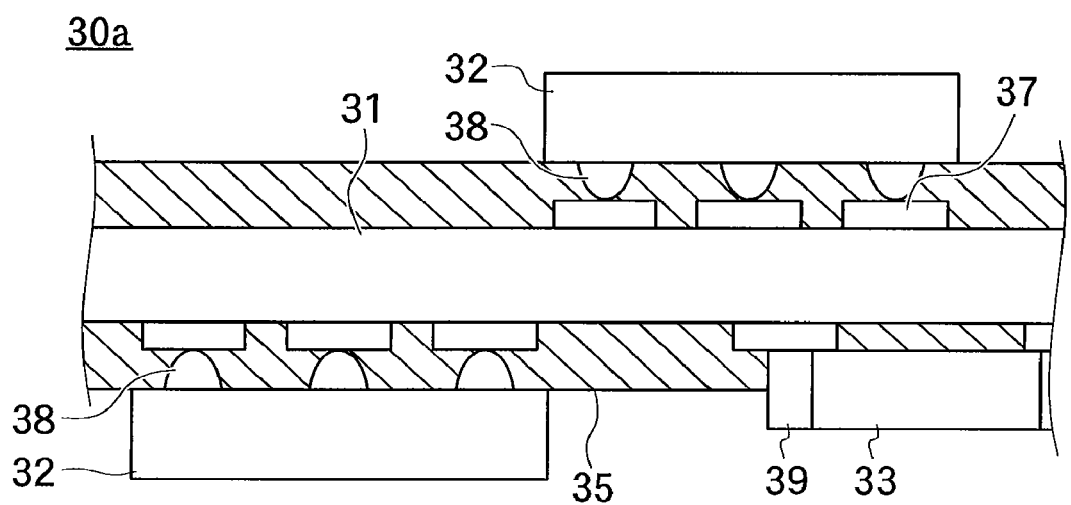

Reference numeral 30 in FIG. 4(a) represents an object to be pressed, and the object to be pressed 30 has a substrate 31, an adhesive film 35, and electric components 32, 33.

Terminals 37 are formed on the front face and the rear face of the substrate 31, and the adhesive film 35 is placed on the terminals 37 on the front face of the substrate 31 and on the terminals 37 on the rear face of the substrate 31.

The electric components 32, 33 have terminals 38, 39 such as bumps or lands, and the electric components 32, 33 are aligned so that the terminals 38, 39 lie above the terminals 37 of the substrate 31, and then individually mounted on the adhesive film 35 by a mounting head not shown, and pressed by a small pressure with the mounting head while they are heated at a relatively low temperature, whereby they are provisionally bonded to the front face and the rear face of the substrate 31 by an adhesive force developed by the adhesive film 35 (provisional compression bonding).

However, the adhesive force is so weak that the electric components 32, 33 readily drop off the substrate 31 by physical impacts, and the terminals 37 of the substrate 31 and the terminals 38, 39 of the electric components 32, 33 are in neither physical nor mechanical contact with each other and the adhesive film 35 exists among the terminals 37, 38, 39.

The adhesive film 35 is larger than the planar shapes of the electric components 32, 33, and partially extends over the electric components 32, 33, and it is exposed between the electric components 32, 33. Even if the adhesive film 35 is not exposed from the electric components 32, 33, the adhesive film 35 will partially extend over the outer peripheries of the electric components 32, 33 by pressing the electric components during the pressing step described below.

The first and second pressing rubbers 15, 25 are formed from a material that can be bonded to the adhesive film 35. Therefore, a protective film 5 having low adhesiveness to the adhesive film 35 is placed on the surface of the second pressing rubber 25 so as to prevent the second pressing rubber 25 from contacting the adhesive film 35, and then the object to be pressed 30 is placed on the second pressing rubber 25 with the front face of the substrate 31 upward and the rear face downward (FIG. 3(a)).

Here, the surface of the second pressing rubber 25 is horizontal, and the protective film 5 has a uniform thickness. Thus, the part of the surface of the protective film 5 on the second pressing rubber 25 is nearly horizontal.

The electric components 32, 33 having different thicknesses are bonded on the rear face of the substrate 31, but the substrate 31 is nearly horizontal because the thickest electric components 32 are apart from each other on the rear face of the substrate 31 or otherwise an auxiliary component for supporting the substrate 31 is placed on the second pressing rubber 25 to hold the substrate by the electric components 32 or auxiliary component.

Then, the protective film 5 is also placed on the object to be pressed 30 to prevent the first pressing rubber 15 from contacting the adhesive film 35, and the front face and the rear face of the object to be pressed 30 are covered with the protective film 5.

If the protective film 5 is larger than the planar shape of the second pressing rubber 25 and the protective film 5 on the second pressing rubber 25 or the protective film 5 on the object to be pressed 30 hangs along the side face of the second pressing rubber 25, the planar shape of the second pressing rubber 25 is smaller than the opening 18 of the concave 17 and the outer shape of the second pressing rubber 25 including the hanging protective film 5 approximately equals to the size of the opening 18.

The planar shape of the object to be pressed 30 is identical to or smaller than the planar shape of the second pressing rubber 25 and the outer periphery of the object to be pressed 30 lies not to extend over the second pressing rubber 25. When the first and second pressing heads 10, 20 are aligned so as to conform the outer periphery of the second pressing rubber 25 including the protective film 5 to the opening 18 and then the first pressing head 10 is lowered, the object to be pressed 30 is inserted into the concave 17 of the first pressing head 10.

When the thickness of the object to be pressed 30 is supposed to be the total of the thickness of the thickest electric components 32 on the front face of the substrate 31 plus the thickness of the thickest electric components 32 on the rear face of the substrate 31 plus the thickness of the substrate 31, the depth of the concave 17, i.e., the height of the edge of the first dam member 33 from the surface of the first pressing rubber 15 is equal to or greater than the total of the thickness of the object to be pressed 30 plus the thickness of the protective film 5 covering the front face and the rear face of the object 30, whereby the object to be pressed 30 enters the concave 17 entirely from the front face to the rear face.

If the depth of the concave 17 is greater than the total of the thickness of the object to be pressed 30 plus the thickness of the protective film 5, the first pressing head 10 descends even after the object to be pressed 30 has entered the concave 17, and the edge of the first dam member 16 does not press the surface of the second pressing rubber 25 and the first pressing head 10 does not stop descending because the outer shape of the second pressing rubber 25 including the protective film 5 is approximately equal to the size of the opening 18.

The protective film 5 is formed from a compressively deformable material. Therefore, even if the outer shape of the second pressing rubber 25 including the protective film 5 is slightly larger than the opening 18, the first pressing head 10 does not stop descending because the protective film 5 compressively deforms and enters the clearance between the second pressing rubber 25 and the first dam member 16.

When the first pressing head 10 is continuously lowered, the object to be pressed 30 and the first pressing rubber 15 move closer to each other.

If multiple types of electric components 32, 33 having different thicknesses are bonded to the front face of the substrate 31, steps are formed on the front face of the substrate 31 by the thickness differences. Here, the surface of the first pressing rubber 15 is nearly horizontal and the first pressing head 10 is vertically lowered. Therefore, if the first pressing head 10 is continuously lowered, the surface of the first pressing rubber 15 comes into contact with the thickest electric components 32 among the electric components 32, 33 bonded to the front face of the substrate 31 via the protective film 5.

FIG. 3(b) shows a state in which the first pressing rubber 15 is in contact with only the thickest electric components 32 before it presses the electric components 32, 33 on the front face of the substrate 31, and in this state where the first pressing rubber 15 is in contact with the thickest electric components 32, the edge of the first dam member 16 is flush with the plane H on which the surface of the second pressing rubber 25 lies or below it because the depth of the concave 17 is equal to or greater than the thickness of the object to be pressed 30 including the protective film 5.

The first and second pressing rubbers 15, 25 are formed from an elastic material that deforms when a force is applied and restores the original shape when the force is removed (e.g., elastomer). The first and second pressing rubbers 15, 25 are deformable at not only central parts but also peripheral parts because the side face of the first pressing rubber 15 is in contact with the inner wall of the hole 19 but not fixed to the inner wall and nothing is placed around the second pressing rubber 25.

Thus, when the first pressing head 10 is lowered from the state shown in FIG. 3(b) to press the object to be pressed 30 by the first and second pressing rubbers 15, 25, the parts of the first and second pressing rubbers 15, 25 having come into contact with the electric components 32 are depressed independently of whether they are central or peripheral.

When the first pressing head 10 is further lowered to bring the first and second pressing rubbers 15, 25 relatively close to each other, the electric components are successively pressed against the first and second pressing rubbers 15, 25 in the order of thickness from thicker ones 32 to thinner ones 33, and finally all of the electric components 32, 33 are pressed against the substrate 31.

The first and second pressing rubbers 15, 25 are formed from a material that is depressed in loaded parts and bulges in other parts such as an internally homogeneous elastic material, and the parts of the first pressing rubber 15 out of contact with the electric components 32, 33 bulge downward, while the parts of the second pressing rubber 25 out of contact with the electric components 32, 33 bulge upward.

At least the surface part of the deformed second pressing rubber 25 entered into the concave 17 and the side face of the part entered into the concave 17 is surrounded by the first dam member 16 even if the surface of the second pressing rubber 25 before deformation is flush with the edge of the first dam member 16 because the first and second pressing rubbers 15, 25 are closer to each other than before they are deformed.

The side face is in close contact with the first dam member 16 or even if a clearance exists between the side face and the first dam member 16, the clearance is too narrow for the bulging first pressing rubber 15 to flow out from the clearance. Therefore, the first pressing rubber 15 does not extend horizontally. Even if the part of the second pressing rubber 25 entered into the concave 17 extends horizontally, the extension is negligible because of the narrow clearance.

Thus, the side face of the part of the second pressing rubber 25 entered into the concave 17 is in close enough contact with the first dam member 16 so as to prevent horizontal extension of the first and second pressing rubbers 15, 25, whereby the bulging parts of the first and second pressing rubbers 15, 25 may be filled in the voids between the electric components 32 and 33 but does not flow horizontally (i.e., in the direction perpendicular to the moving direction of the first pressing head 10).

No outward force is exerted on the electric components 32, 33 and the electric components 32, 33 are pressed against the adhesive film 35 at the same positions as those of provisional compressing bonding because the surface parts of the first and second pressing rubbers 15, 25 do not extend horizontally.

Here, the second head body 21 has a heater 28 so that the object to be pressed 30 is heated at a predetermined temperature by activating the heater 28, and the flowability of the adhesive film 35 is increased by heating.

Thus, when the electric components 32, 33 are pressed against the adhesive film 35, the adhesive film 35 is thrust aside and the terminals of the electric components 32, 33 are forced into the adhesive film 35 so that the terminals 38, 39 of the electric components 32, 33 directly come into contact with the terminals 37 of the substrate 31, whereby the electric components 32, 33 and the substrate 31 are electrically connected to each other.

If the adhesive film 35 contains a thermosetting resin, the adhesive film 35 is cured by heating, and if the adhesive film 35 contains a thermoplastic resin, the adhesive film 35 becomes solidified when the temperature drops after completion of heating.

Thus, the electric components 32, 33 are also mechanically connected to the substrate 31 via the cured or solidified adhesive film 35, thereby obtaining an electric device 30a (FIG. 3(c)).

If the electric components 32, 33 are misaligned when they are pressed, the reliability of the electric device 30a is deteriorated because the terminals 38, 39 of the electric components 32, 33 fail to come into contact with the terminals 37 of the substrate 31, but the electric device 30a prepared by using the compression bonding device 1 of the present embodiment is highly reliable because the electric components 32, 33 are not misaligned by using the compression bonding device 1 of the present embodiment as described above.

Even if the adhesive film 35 extends over the outer peripheries of the electric components 32, 33 when the electric components 32, 33 are pressed, the first and second pressing rubbers 15, 25 do not directly come into contact with the adhesive film 35 because a protective film 5 lies between the first pressing rubber 15 and the object to be pressed 30, and between the second pressing rubber 25 and the object to be pressed 30.

Thus, the first and second pressing rubbers 15, 25 are not bonded to the adhesive film 35, and when the first pressing head 10 is moved upward, the first pressing rubber 15 is separated from the electric device 30a, and when the electric device 30a is raised, the electric device 30a is separated from the second pressing rubber 25, whereby the electric device 30a can be removed from the compression bonding device 1.

The foregoing description relates to cases in which the object to be pressed 30 is entered into the concave 17 preliminarily formed in the pressing head 10 and then the first pressing rubber 15 is contacted with the object to be pressed 30, but the embodiments are not limited to such cases.

Figure 5:
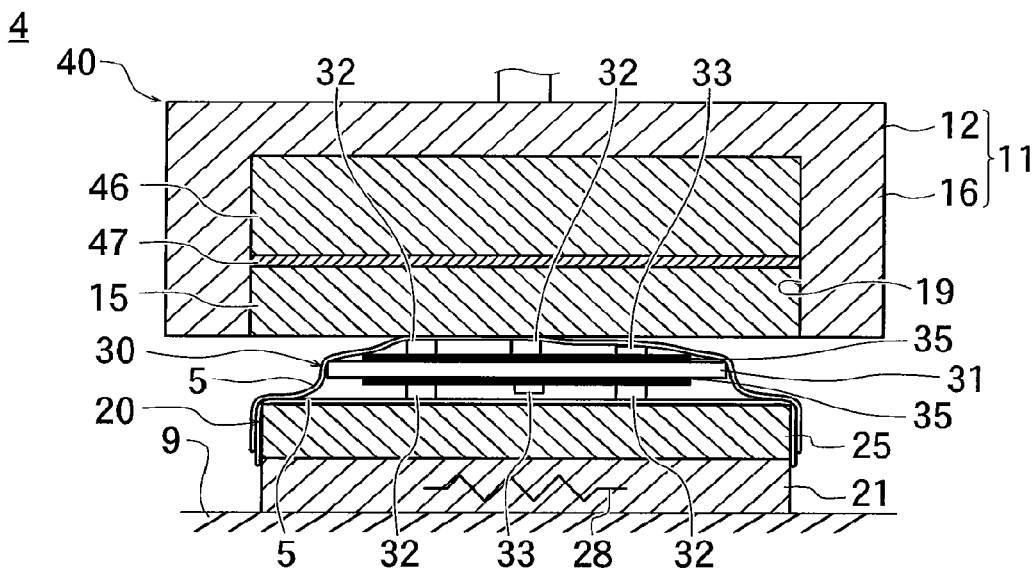
FIG. 5(a)-(c) are sectional diagrams for illustrating a process for packaging electric components using a compression bonding device according to a second embodiment.
Figure 5:
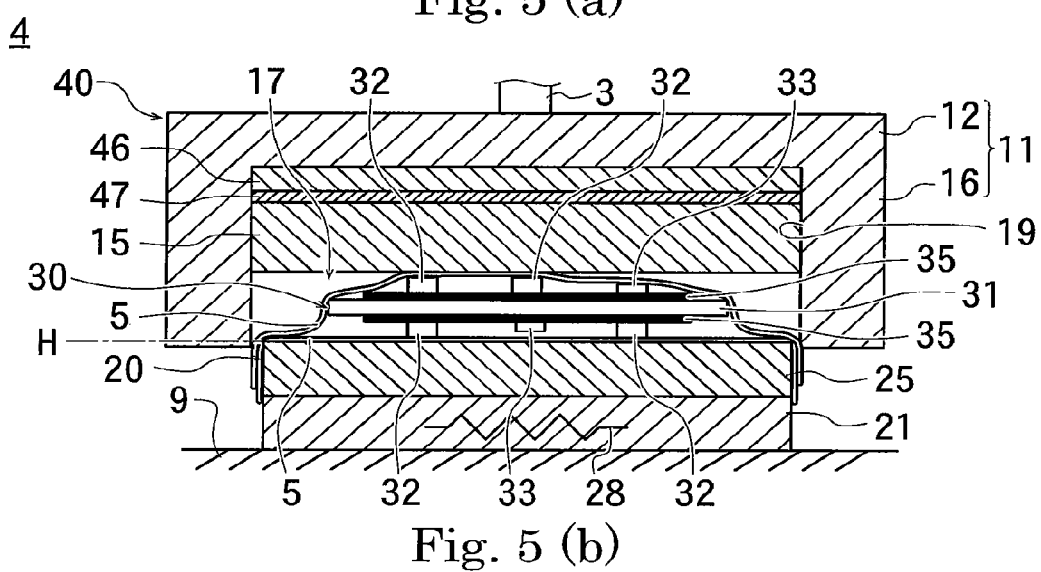
Figure 5:
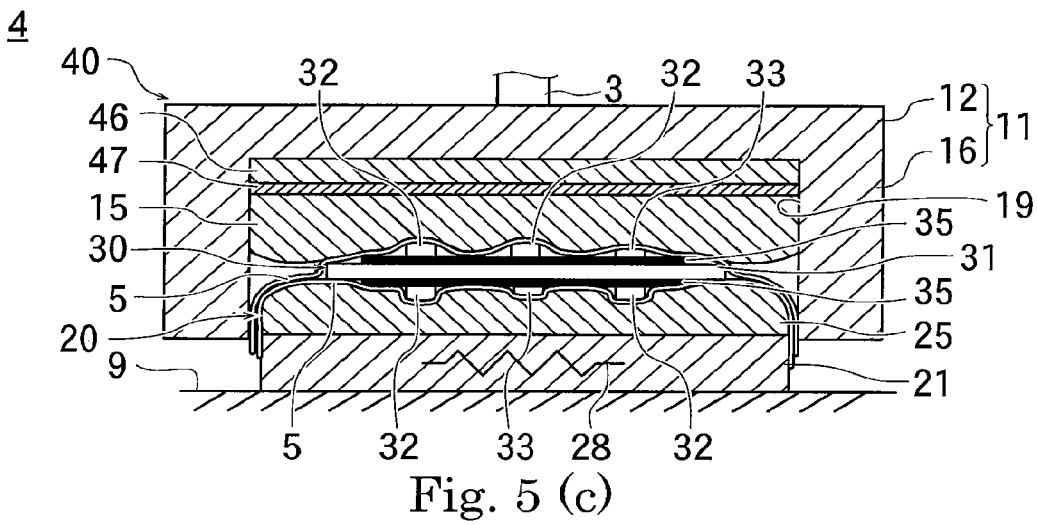

Reference numeral 4 in FIG. 5(a) represents a compression bonding device according to a second embodiment, and this compression bonding device 4 has the same structure as that of the compression bonding device 1 according to the first embodiment and the layout of the first and second pressing heads 10, 20 is also similar except that a first compression member 46 is placed between the first pressing rubber 15 and the first pressing plate 12.

In contrast to the first pressing rubber 15, which is formed from an internally homogeneous elastic material as described above, the first compression member 46 is formed from a material having internal voids that are collapsed under pressure to decrease the volume, such as sponge-like rubber.

A movable plate 47 is placed between the first pressing rubber 15 and the first compression member 46, and the first compression member 46 is fitted to the surface of the first pressing plate 12 at the upper end and to the surface of the movable plate 47 at the lower end, while the upper end of the first pressing rubber 15 is fitted to the bottom face of the movable plate 47. Thus, the first compression member 46, movable plate 47, and first pressing rubber 15 are arranged in the aforementioned order from the first pressing plate 12 in a vertical downward direction.

Similarly to the first pressing rubber 15, the first compression member 46 has the same columnar shape in horizontal section as the sectional shape of a part surrounded by the first dam member 16, and the side face of the first compression member 46 is in contact with the first dam member 16.

However, the side face of the first compression member 46 is not fixed to the first dam member 16, and neither first pressing rubber 15 nor movable plate 47 is fixed to the first dam member 16. Thus, the first pressing rubber 15 and the movable plate 47 are movable within the part surrounded by the first dam member 16 when the thickness of the first compression member 46 changes.

To prepare an electric device using this compression bonding device 4, the object to be pressed 30 is placed on the second pressing rubber 25 via the protective film 5 and the first pressing rubber 15 is brought to contact with the thickest electric component 32 via the protective film 5 in the same manner with the compression bonding device 1 according to the first embodiment.

The force required to deform the first compression member 46 is smaller than the force required to deform the first and second pressing rubbers 15, 25. When the first pressing head 10 is further lowered to press the first pressing plate 12 against the first compression member 46, the first compression member 46 is compressed to reduce the thickness before the first and second pressing rubbers 15, 25 deform.

As described above, the first pressing rubber 15 is movable within the part surrounded by the first dam member 16, and therefore, when the thickness of the first compression member 46 is reduced, the first pressing rubber 15 moves upward to form a concave that has not existed before the first compression member 46 is compressed, and the object to be pressed 30 is entered into the concave.

The compression of the first compression member 46 stops when it deforms to some extent due to the limitation of the amount by which the first compression member 46 deforms.

FIG. 5(b) shows a state in which the compression of the first compression member 46 stops before the first and second pressing rubbers 15, 25 deform. In this state, the edge of the first dam member 16 projects below the surface of the first pressing rubber 15 by a distance the first pressing rubber 15 has moved upward, whereby the edge is flush with the plane H on which the surface of the second pressing rubber 25 lies or projects below it.

When the first pressing head 10 is further lowered after the first compression member 46 stops deforming, the first and second pressing rubbers 15, 25 are pressed against the electric components 32, 33 and depressed while the parts out of contact with the electric components 32, 33 bulge, but the surface of the first pressing rubber 15 does not extend horizontally because of the small clearance between the second pressing rubber 25 and first dam member 16 in the same manner as with the compression bonding device 1 according to the first embodiment.

Moreover, the surface of the second pressing rubber 25 may bulge upward but does not extend horizontally because at least the surface part of the second pressing rubber 25 is entered into the concave 17 by deformation of the first and second pressing rubbers 15, 25. Thus, this compression bonding device 4 also prevents horizontal displacement of the electric components 32, 33, thereby obtaining a highly reliable electric device 30a.

Figure 6:
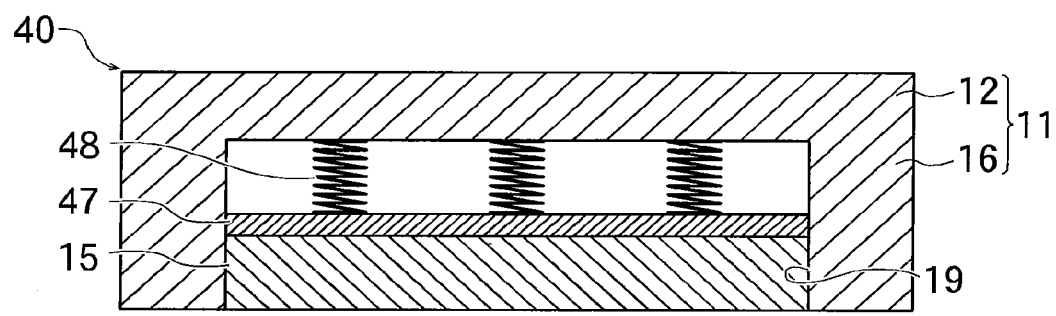
FIG. 6 is a sectional diagram for illustrating another embodiment of the compression member.

The first compression member 46 is not specifically limited so far as it decreases the volume by pressing, and the compression member may is formed from a spring 48 as shown in FIG. 6, and the spring 48 is compressed by pressing the first pressing plate 12 to decrease the length and raise the surface of the first pressing rubber 15, thus forming a concave. If the force applied to the first pressing rubber 15 can be transferred to the first compression member 46, there is no special need for providing the movable plate 47.

The foregoing description relates to cases in which the first pressing plate 12 is fitted to the shaft 3 of the drive unit 2 and the first pressing head 10 is moved to bring the first and second pressing rubbers 15, 25 close to each other, but the present invention is not limited to such cases, and the second pressing head 20 may be moved while the first pressing head 10 is fixed, or both of the first and second pressing heads 10, 20 may be moved as far as the first and second pressing rubbers 15, 25 can be relatively moved.

The foregoing description relates to cases in which the object to be pressed 30 is placed on the surface of the second pressing rubber 25 and then the first pressing head 10 is lowered, but the embodiment is not limited to such cases.

The second pressing head 20 is placed while the side on which the second pressing rubber 25 is placed is faced downward and the first pressing head 10 is placed below the second pressing head 20 while the side on which the concave 17 is formed is faced upward. The object to be pressed 30 is placed on the bottom face of the concave 17, i.e. the surface of the first pressing rubber 15, and then either one or both of the first and second pressing heads 10, 20 is moved. The first and second pressing rubbers 15, 25 move closer together, and the surface of the second pressing rubber 25 may be pressed against the object to be pressed 30.

The embodiments are is not limited to cases where the surfaces of the first and second pressing rubbers 15, 25 are horizontally oriented, but the first and second pressing head 10, 20 may be placed in such a manner that the surfaces of the first and second pressing rubbers 15, 25 are nearly vertical.

The moving direction of the first and second pressing head 10, 20 are moved is not specifically limited, either, but they are preferably moved nearly in a perpendicular direction to the front face and the rear face of the substrate 31 to prevent misalignment of the electric components 32, 33. Therefore, if the substrate 31 is parallel with the surfaces of the first and second pressing rubbers 15, 25, the first and second pressing head 10, 20 are moved in a nearly perpendicular direction to the surfaces of the first and second pressing rubbers 15, 25.

The foregoing description relates to cases in which nothing is placed around the second pressing rubber 25 and its side face is exposed, but the embodiment is not limited to such cases, and the side face of the second pressing rubber 25 may be covered with e.g., a metal thin plate (sliding plate) to prevent the first dam member 16 from rubbing against the second pressing rubber 25.

When the second pressing head 20 is entered into the concave 17 in cases where the side face of the second pressing rubber 25 is covered with a sliding plate, the first pressing rubber 15 does not extend horizontally because the sliding plate comes into close contact with the first dam member 16 or even if a clearance exists between the sliding plate and the first dam member 16, the clearance is too narrow for the bulging first pressing rubber 15 to flow out from it.

The sliding plate has a small thickness so that even if it deforms along with the second pressing rubber 25, it comes into contact with the first dam member 16, to thereby stop deforming. Because of the small clearance between the first dam member 16 and the sliding plate before it deforms, the amount of deformation is small, and therefore, the horizontal extension of the second pressing rubber 25 is negligible.

Even if the surface edge of the second pressing rubber 25 bulges to extend over the sliding plate, the amount of horizontal extension over the sliding plate is small because of the small thickness of the sliding plate as well as the small clearance between the sliding plate and the first dam member 16 as described above.

Thus, the electric components 32, 33 are less likely to be misaligned because the first and second pressing rubbers 15, 25 do not horizontally extend, and even if they extend, the amount of extension is negligible.

If the clearance between the first dam member 16 and the second pressing rubber 25 is large in the compression bonding devices 1, 4 according to the first and second embodiments, the clearance can be filled with the protective film 5 by covering the side face of the second pressing rubber 25 with the protective film 5.

Thus, the first dam member 16 can be prepared at low costs without using any metallic mold, and even if the molding precision is low, the clearance between the first dam member 16 and the second pressing rubber 25 can be filled by appropriately selecting the thickness of the protective film 5, to thereby prevent the first pressing rubber 15 from flowing out from the clearance.

The foregoing description relates to cases in which a dam member is provided on only the first pressing head 10, but embodiment is not limited to such cases.

Figure 7:
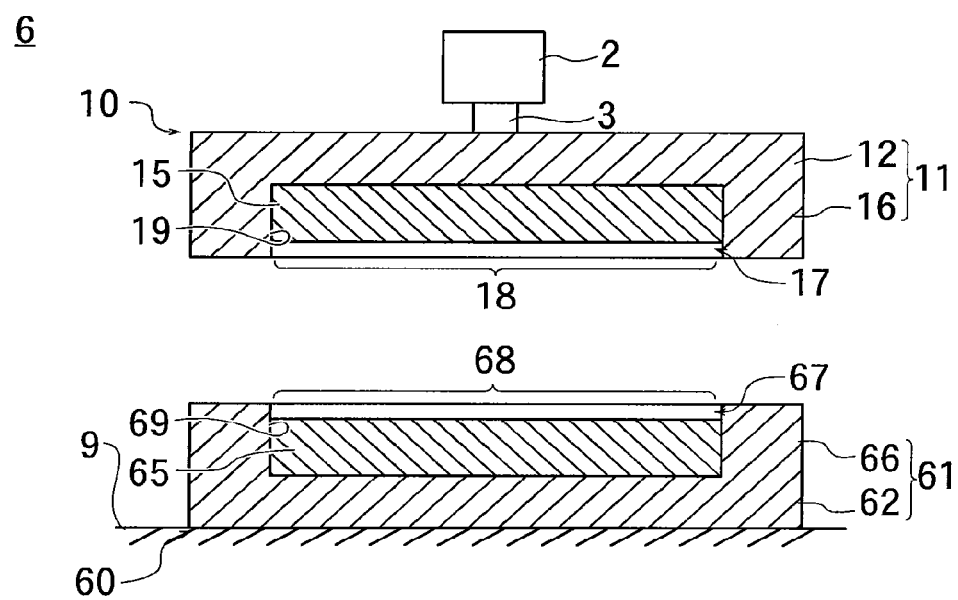
FIG. 7 is a sectional diagram for illustrating a compression bonding device according to a third embodiment.

Reference numeral 6 in FIG. 7 represents a compression bonding device according to a third embodiment, and this compression bonding device 6 has a third pressing head 60 in addition to the first pressing head 10 described above.

The structures of the first and third pressing heads 10, 60 are identical, and the first and third pressing heads 10, 60 have first and third head bodies 11, 61, holes 19, 69 having bottoms (first and third holes) formed in the first and third head bodies 11, 61, and first and third pressing rubbers 15, 65 placed in the first and third holes 19, 69, respectively.

The layout of the first and third pressing rubbers 15, 65 is also similar, and the first and third pressing rubbers 15, 65 are surrounded by first and third dam members 16, 66 having the side walls of the first and third holes 19, 69, respectively. The edges of the first and third dam members 16, 66 highly project from the surfaces of the first and third pressing rubbers 15, 65 and first and third concaves 17, 67, which have the surface of the first and third pressing rubbers 15, 65 as bottom faces and the first and the third dam members 16, 66 as side faces, are formed.

The first and third holes 19, 69 have openings 18, 68 having nearly the same shape so that when the edges of the openings 18, 68 are aligned and the first and third pressing heads 10, 60 are pressed against each other, the edges of the first and third dam members 16, 66 come into contact with each other.

Here, the layout of the first pressing head 10 and the connection with the drive unit 2 are the same as described about the first pressing head 10 of the compression bonding device 1 according to the first embodiment, and the first pressing head 10 can be vertically moved upward and downward by the drive unit 2 above the platform 9 while the surface of the first pressing rubber 15 remains nearly horizontal.

The third pressing head 60 is placed on the platform 9 with the opening 68 of the third concave 67 upward, and the bottom face of the third concave 67, i.e. the surface of the third pressing rubber 65 is nearly horizontal and forms a mounting face on which the object to be pressed 30 is to be mounted.

Next, a process for connecting the object to be pressed 30 described above using this compression bonding device 6 is explained.

Figure 8:
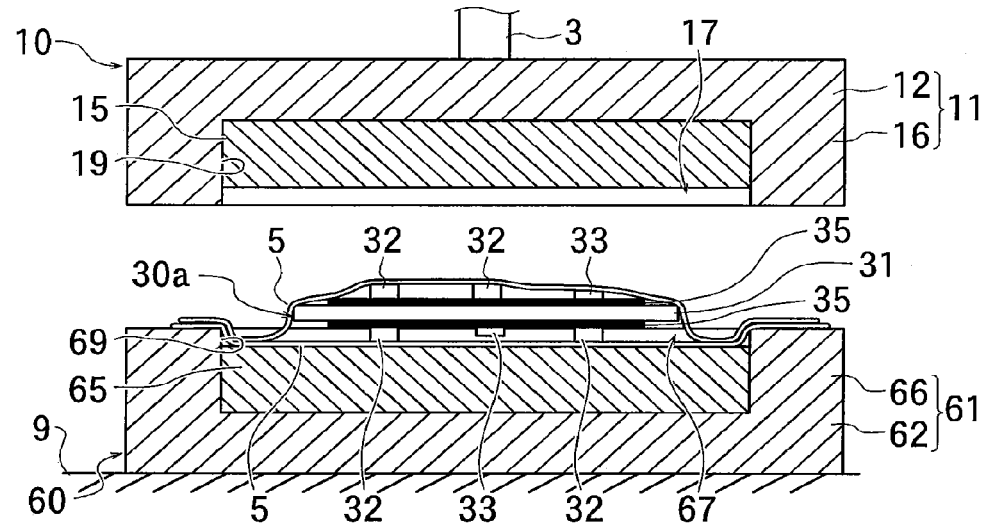
FIG. 8(a)-(c) are sectional diagrams for illustrating a process for packaging electric components on a substrate.
Figure 8:
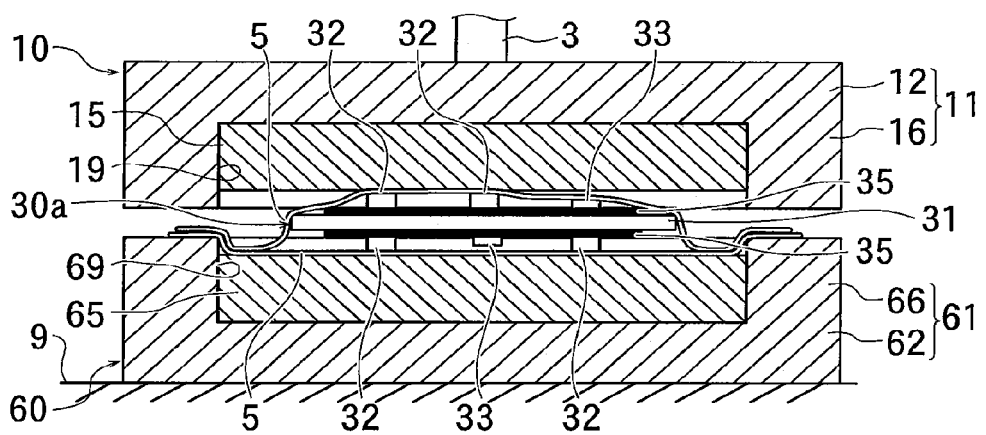
Figure 8:
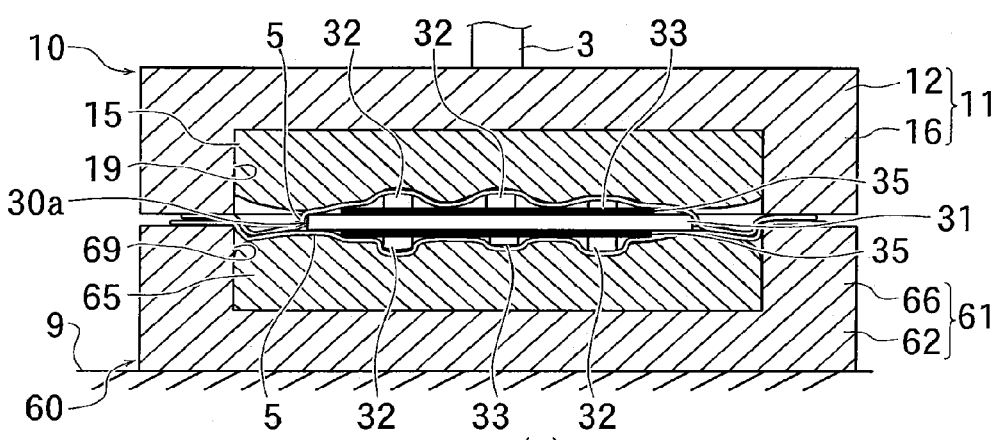

The first and third pressing rubbers 15, 65 are formed from a material having high adhesiveness to the adhesive film 35, and the protective film 5 described above is placed on the surface of the third pressing rubber 65 to prevent contact with the adhesive film 35 and then the object to be pressed 30 is placed on the third pressing rubber 65, and the protective film 5 is also placed on the surface of the object to be pressed 30 (FIG. 8(a)).

The total of the depths of the first and third concaves 17, 67 (i.e., the total of the height from the surface of the first pressing rubber 15 to the edge of the first dam member 16 plus the height from the surface of the third pressing rubber 65 to the edge of the third dam member 66) is smaller than the total of the thickness of the object to be pressed 30 plus the thickness of the protective film 5 covering the front face and the rear face thereof.

Thus, when the edges of the openings 18, 68 of the first and third concaves 17, 67 are aligned and then the first pressing head 10 is lowered, the surface of the first pressing rubber 15 comes into contact with the object to be pressed 30 via the protective film 5 before the edges of the first and third dam members 16, 66 come into contact with each other.

FIG. 8(b) shows a state in which the first pressing rubber 15 is in contact with the surface of the object to be pressed 30 via the protective film 5 before the first and third pressing rubbers 15, 65 press the object to be pressed 30, and in this state, a clearance exists between the edge of the first dam member 16 and the edge of the third dam member 66.

If the parts of the first and third head bodies 11, 61 with which the bottom faces of the first and third pressing rubbers 15, 65 are in close contact are designated as first and third pressing plates 12, 62, the first and third pressing rubbers 15, 65 are fixed to the first and third pressing plates 12, 62 at the bottom faces respectively but not fixed to the first and third dam members 16, 66 at the side faces. The first and third pressing rubbers 15, 65 are deformable at both central and peripheral parts.

Thus, when the first pressing head 10 is further lowered to bring the first and third pressing rubbers 15, 65 relatively close to each other, the electric components are successively pressed against the first and third pressing rubbers 15, 65 in the order of thickness from thicker ones 32 to thinner ones 33 in the same manner as with the compression bonding device 1 according to the first embodiment, whereby the parts of the first and third pressing rubbers 15, 65 out of contact with the electric components 32, 33 bulge to press the object to be pressed 30.

The pressure for pressing the object to be pressed 30 is predetermined depending on the thicknesses of the adhesive film 35 and the electric components 32, 33, the temperature at which the adhesive film 35 is heated, etc.

The aforementioned total of the depths of the first and third concaves 17, 67 is determined in such a manner that the edges of the first and third dam members 16, 66 may not directly come into contact with each other even if the first and third pressing rubbers 15, 65 deform when the object to be pressed 30 is pressed at the predetermined pressure. Therefore, the first pressing head 10 descends as long as the first and third pressing rubbers 15, 65 continue to deform, and after the first and third pressing rubbers 15, 65 have stopped deformation, the force for lowering the first pressing head 10 converts into the force for pressing the object to be pressed 30 (FIG. 8(c)).

Even if the edge of the protective film 5 extends over the openings 18, 68 and the edges of the first and third dam members 16, 66 come into contact with each other via the extending protective film 5, the protective film 5 compressively deforms to ensure that the object to be pressed 30 is continuously pressed so far as the protective film 5 is formed from a compressively deformable material.

When the object to be pressed 30 is pressed, the surfaces of the first and third pressing rubbers 15, 65 bulge, but the bulging parts of the first and third pressing rubbers 15, 65 are stopped by the first and third dam members 16, 66 because the edges of the first and third dam members 16, 66 project from the surfaces of the first and third pressing rubbers 15, 65. Thus, this compression bonding device 6 also prevents horizontal extension of the first and third pressing rubbers 15, 65 and misalignment of the electric components 32, 33.

Heating means is provided on either one or both of the first and third pressing heads 10, 60 so that the electric components 32, 33 are not only electrically but also mechanically connected to the substrate 31 by pressing the object to be pressed 30 under heat in the same manner as with the compression bonding device 1 according to the first embodiment, thereby obtaining an electric device 30a.

The foregoing description relates to cases in which the first and third concaves 17, 67 are formed before the first and third pressing rubbers 15, 65 deform, but the embodiment is not limited to such cases.

Figure 9:
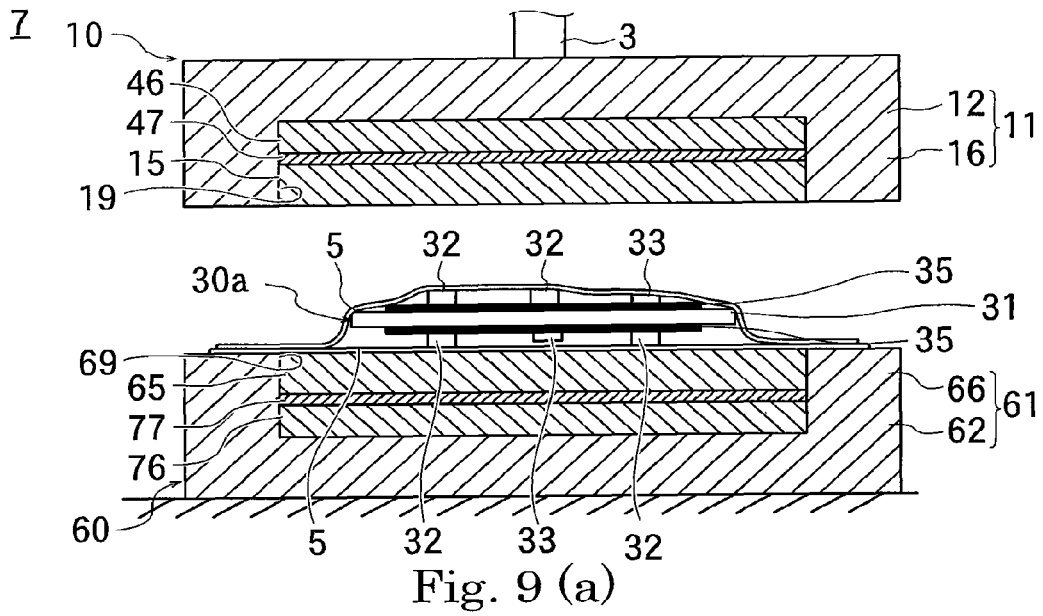
FIG. 9(a)-(c) are sectional diagrams for illustrating a process for packaging electric components on a substrate using a compression bonding device according to a fourth embodiment.
Figure 9:
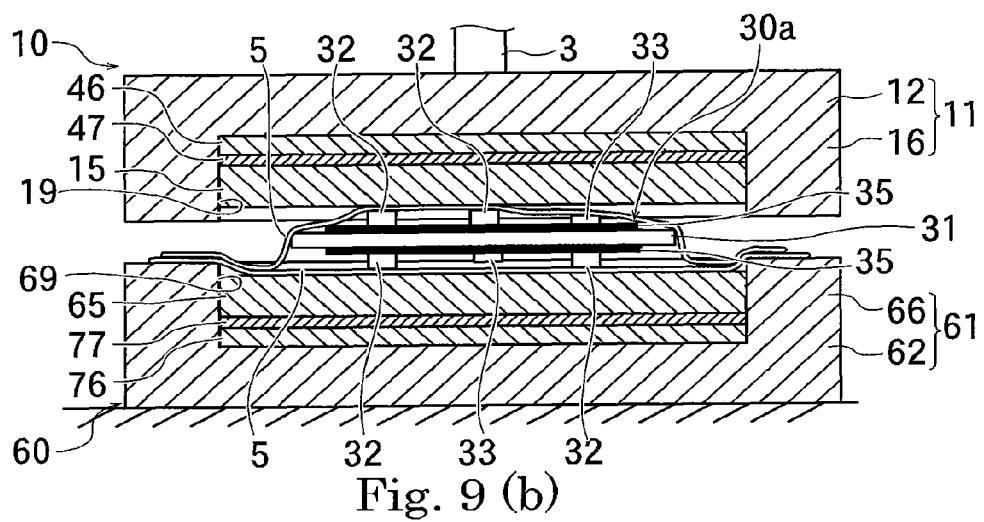
Figure 9:
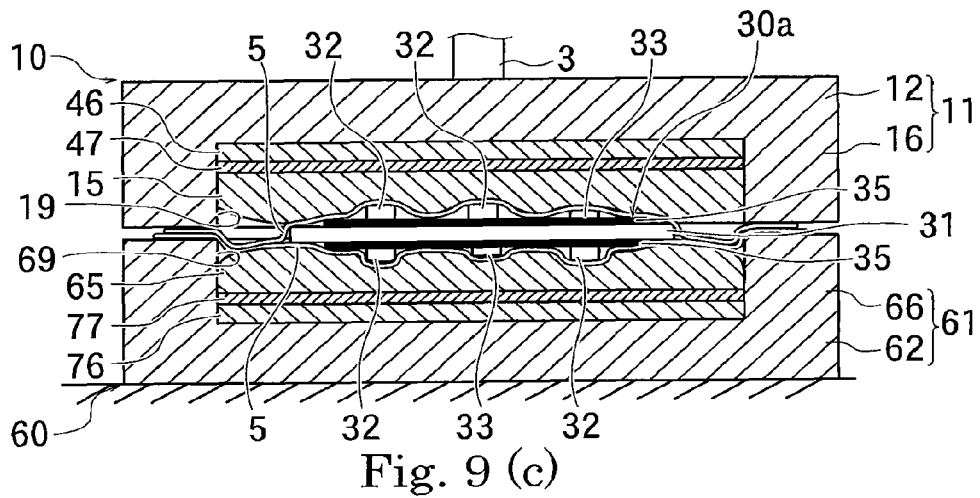

Reference numeral 7 in FIG. 9(a) represents a compression bonding device according to a fourth embodiment. This compression bonding device 7 has the same structure as that of the compression bonding device 6 according to the third embodiment described above and the layout of the first and third pressing heads 10, 60 is also similar to that of the compression bonding device 6 according to the third embodiment described above except that first and third compression members 46, 76 are placed between the first and third pressing plates 12, 62 and the first and third pressing rubbers 15, 65.

The structure and layout of the first and third compression members 46, 76 are similar to those of the first compression member 46 of the compression bonding device 4 according to the second embodiment. When the object to be pressed 30 is sandwiched between the first and third pressing rubbers 15, 65, the first and third compression members 46, 76 are compressed to reduce the thickness and the first and third pressing rubbers 15, 65 are pressed against the first and third pressing plates 12, 62 and move with the movable plate 47, 77 in the holes 19, 69 before the first and third pressing rubbers 15, 65 deform.

FIG. 9(b) shows a state in which the first and third compression members 46, 76 have reduced the thickness before the first and third pressing rubbers 15, 65 deform. The first and third pressing rubbers 15, 65 get close to the first and second pressing plates 12, 62 to form concaves which have the surfaces of the first and third pressing rubbers 15, 65 as bottom faces and the first and third dam member 16, 66 as side walls.

The total of the depths of the concaves here (i.e., the total of the height from the surface of the first pressing rubber 15 to the edge of the first dam member 16 plus the height from the surface of the third pressing rubber 65 to the edge of the third dam member 66 when the first and third compression members 46, 76 are compressed) is smaller than the thickness of the object to be pressed 30, including the protective film 5 on the surface of the third pressing rubber 65 and the protective film 5 on the front face of the object to be pressed 30.

When the first and third compression members 46, 76 are compressed, the edges of the first and third dam members 16, 66 do not come into contact with each other and nothing prevents the first pressing head 10 from descending. Therefore, when the first pressing head 10 is further lowered, the first and third pressing rubbers 15, 65 more closer to each other and the first and third pressing rubbers 15, 65 in contact with the electric components 32 are depressed. Finally, all of the electric components 32, 33 are pressed by the first and third pressing rubbers 15, 65.

The total of the depths of the concaves described above is determined in such a manner that the edges of the first and third dam members 16, 66 may not directly come into contact with each other and that a predetermined pressure may be applied to the object to be pressed 30. Therefore, if the object to be pressed 30 is continuously pressed under heat, the electric components 32, 33 are connected to the substrate 31 to obtain an electric device 30a in the same manner as with the compression bonding device 1 according to the first embodiment.

When the electric components 32, 33 are pressed by the first and third pressing rubbers 15, 65, the parts of the first and third pressing rubbers 15, 65 out of contact with electric components 32, 33 bulge. However, the first and third pressing rubbers 15, 65 are stopped by the first and third dam members 16, 66 and do not extend horizontally because the first and third dam members 16, 66 project from the first and third pressing rubbers 15, 65 when the electric components 32, 33 are pressed. Thus, this compression bonding device 7 also prevents misalignment of electric components 32, 33, thereby obtaining a highly reliable electric device 30a.

The foregoing description relates to cases in which at least the first pressing rubber 15 is preliminarily surrounded by the first dam members 16, but the embodiment is not limited to such cases.

Figure 10:
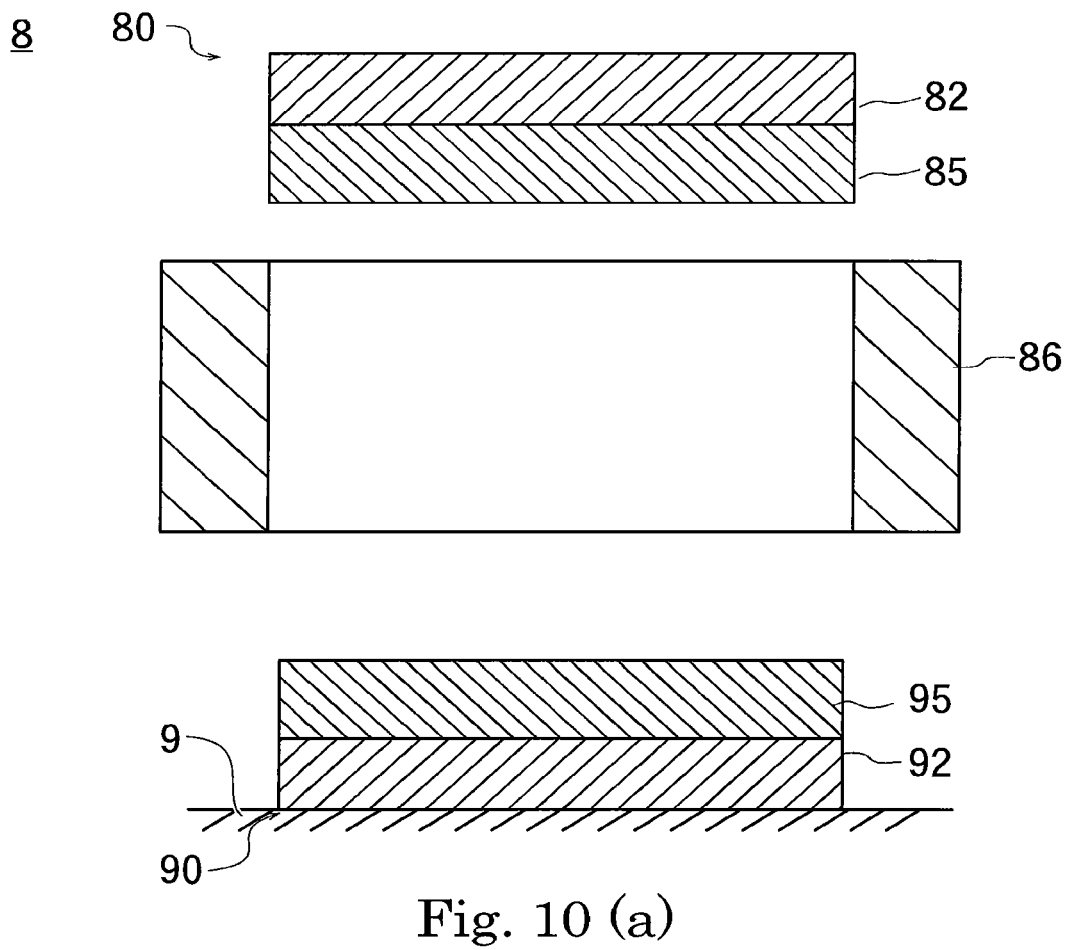
FIG. 10(a) is a sectional diagram for showing a state in which a dam member is separated from fourth and fifth pressing rubbers.
FIG. 10(b) is a sectional diagram for showing a state in which a dam member surrounds fourth and fifth pressing rubbers.
Figure 10:
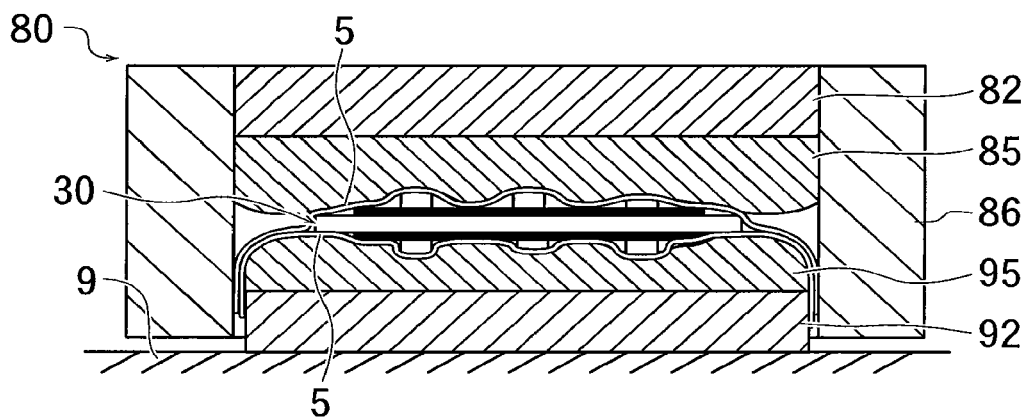

Reference numeral 8 in FIG. 10(a) represents a compression bonding device according to a fifth embodiment, and this compression bonding device 8 has fourth and fifth pressing heads 80, 90 and a dam member 86.

The fourth and fifth pressing heads 80, 90 has fourth and fifth metal pressing plates 82, 92, and fourth and fifth pressing rubbers 85, 95 placed on the fourth and fifth pressing plates 82, 92, wherein nothing is placed around the fourth and fifth pressing rubbers 85, 95 so that the side faces of the fourth and fifth pressing rubbers 85, 95 are exposed.

The planar shapes of the surfaces of the fourth and fifth pressing rubbers 85, 95 are identical or similar.

Figure 11:
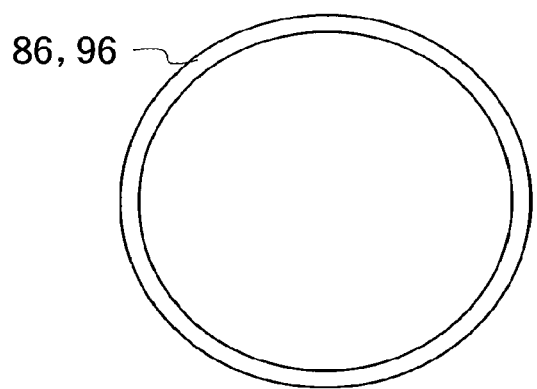
FIG. 11 is a plan view for illustrating an embodiment of a dam member.

As shown in FIG. 11, the dam member 86 is tubular and the openings at both ends of the tube has the same shape as those of the surfaces of the fourth and fifth pressing rubbers 85, 95 or a similar shape slightly larger than them. Thus, at least surface parts of the fourth and fifth pressing rubbers 85, 95 can be inserted into the openings of the dam member 86.

Here, the side faces of the fourth and fifth pressing rubbers 85, 95 are nearly perpendicular to their surfaces, and the planar shapes of the fourth and fifth pressing rubbers 85, 95 cut in a direction parallel to the surfaces are nearly uniform from the surface to the bottom face.

The dam member 86 has an inner wall face nearly perpendicular to the openings at both ends and the sectional shape cut in a direction parallel to the openings is nearly uniform from one end to the other so that not only surface parts but also the side faces of the fourth and fifth pressing rubbers 85, 95 can be inserted into the dam member 86.

The fourth pressing head 80 is placed while the side, on which the fourth pressing rubber 85 is placed, is faced downward. The platform 9 lies below the fourth pressing head 80, and the fifth pressing head 90 is placed on the platform 9 while the side, on which the fifth pressing rubber 95 is placed, is faced upward.

The fourth pressing rubber 85 is inserted into the tube from one end of the dam member 86 by transferring means (not shown), and the dam member 86 is fitted to the fourth pressing head 80. In this state, the other end of the dam member 86 projects below the surface of the fourth pressing rubber 85.

The protective film 5 is placed on the surface of the fifth pressing rubber 95, then the object to be pressed 30 is placed on the protective film 5, and the protective film 5 is further placed on the front face of the object to be pressed 30. When the dam member 86 is lowered with the fourth pressing head 80 after an alignment has been made in such a manner that the outer periphery of the surface of the fifth pressing rubber 95 may lie in the opening at the lower end of the dam member 86, the object to be pressed 30 is inserted into the dam member 86, whereby the fourth pressing rubber 85 comes into contact with the object to be pressed 30 via the protective film 5.

The length of the tube of the dam member 86 is such that the lower end may be flush with or project below the surface of the fifth pressing rubber 95 when the fourth pressing rubber 85 comes into contact with the object to be pressed 30 before the fourth and fifth pressing rubbers 85, 95 deform, whereby the electric components 32, 33 are less likely to be misaligned because the fourth and fifth pressing rubbers 85, 95 do not horizontally extend when the object to be pressed 30 is pressed in the same manner as with the compression bonding device 1 according to the first embodiment described above.

The foregoing description relates to cases in which the dam member 86 is integrally molded in a tubular form, but the embodiments are not limited to such cases.

Figure 12:
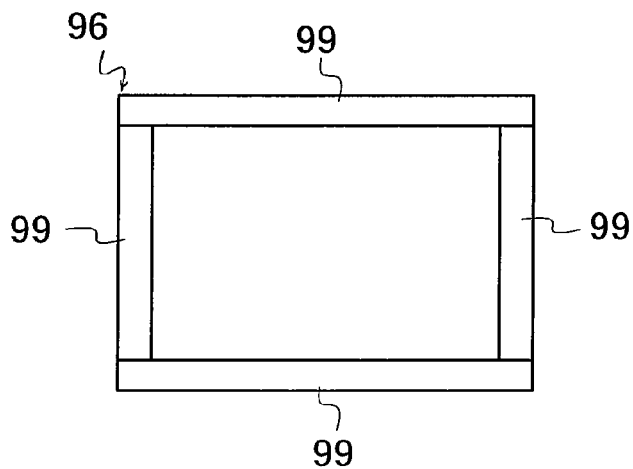
FIG. 12 is a plan view for illustrating another embodiment of a dam member.

Reference numeral 96 in FIG. 12 represents another embodiment of a dam member, and the dam member 96 has multiple plate-shape wall members 99, and the wall members 99 are arranged along the side face of the fourth pressing rubber 85 with their surfaces vertically directed and fitted to the fourth pressing plate 82 by moving means not shown, to form a tube surrounding the fourth pressing rubber 85.

In this state, the lower end of each wall member 99 projects below the surface of the fourth pressing rubber 85 so that the lower end of the tube surrounding the fourth pressing rubber 85 projects below the surface of the fourth pressing rubber 85 and the object to be pressed 30 and the fifth pressing rubber 95 can be inserted into the downward projecting part.

The foregoing description relates to cases in which dam members 86, 96 are provided on the fourth pressing head 80, but the embodiments are not limited to such cases, and the dam members 86, 96 may be placed to surround the fifth pressing rubber 95 and project above the surface of the fifth pressing rubber 95 at one end, in which case when the fourth pressing head 80 is lowered, the fourth pressing rubber 85 is entered into a concave formed by the dam members 86, 96 and the surface of the fifth pressing rubber 95.

Alternatively, the dam members 86, 96 may be fitted to neither fourth nor fifth pressing head 80, 90, but surround the fourth and fifth pressing rubbers 85, 95 after the fourth and fifth pressing rubbers 85, 95 are opposed on both sides of the object to be pressed 30 before pressing of the object to be pressed 30 starts.

Alternatively, the object to be pressed 30 may be pressed after the dam members 86, 96 have been fitted to the fourth and fifth pressing rubbers 85, 95, respectively. In this case, the dam members 86, 96 fitted to the fourth and fifth pressing rubbers 85, 95 preferably have the same structure and layout as those of the first and third dam members 16, 66 of the compression bonding device 6 according to the third embodiment described above.

The length of the dam members 86, 96 and the layout of the dam members 86, 96 are not specifically limited, either, and the fourth and fifth pressing rubbers 85, 95 may be entirely surrounded from the front face to the bottom face or not only the fourth and fifth pressing rubbers 85, 95 but also the fourth and fifth pressing plates 82, 92 may be surrounded so far as at least the surface parts of the fourth and fifth pressing rubbers 85, 95 are surrounded when the object to be pressed 30 is pressed.

Also in the compression bonding device 8 according to the fifth embodiment, the fourth and fifth pressing rubbers 85, 95 may be directly fitted to the fourth and fifth pressing plates 82, 92 or a compression member may be provided between the fourth and fifth pressing plates 82, 92 and the fourth and fifth pressing rubbers 85, 95 as described for the compression bonding device 7 according to the fourth embodiment.

Figure 13:
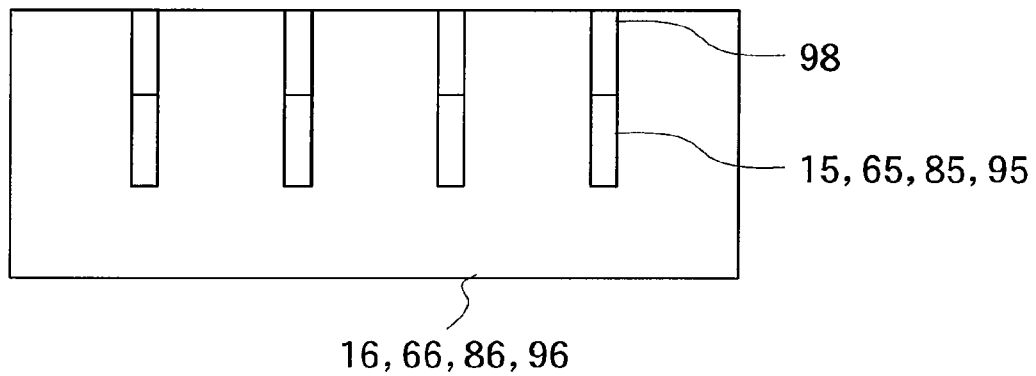
FIG. 13 is a side view for illustrating a dam member having slits.
Figure 14:
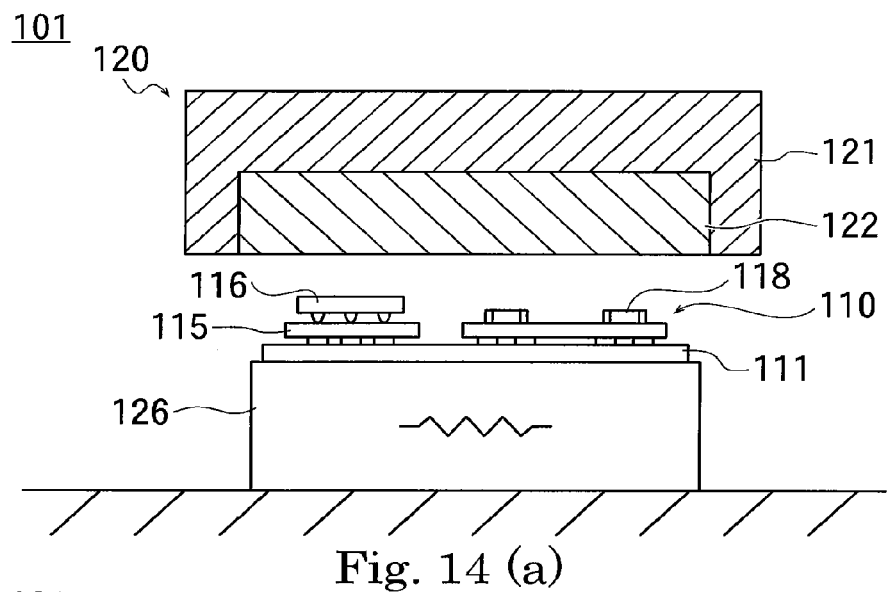
FIG. 14(a) and (b) are sectional diagrams for illustrating a conventional compression bonding device.
Figure 14:
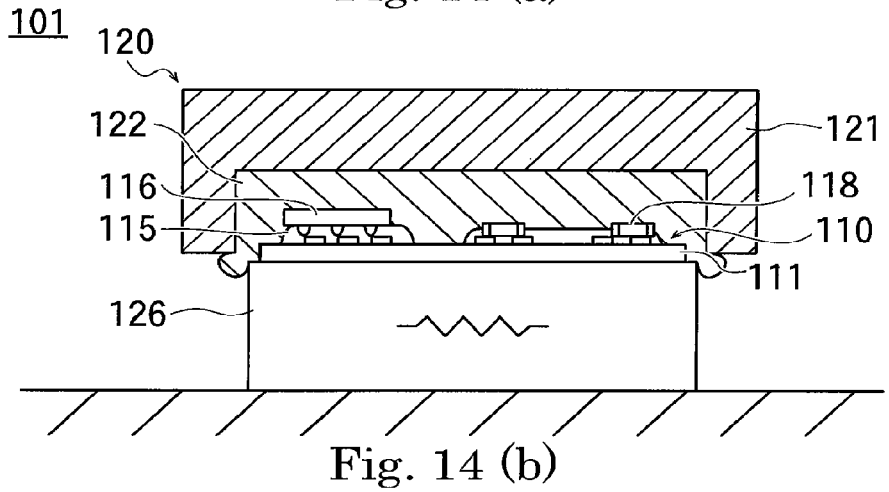
Figure 15:
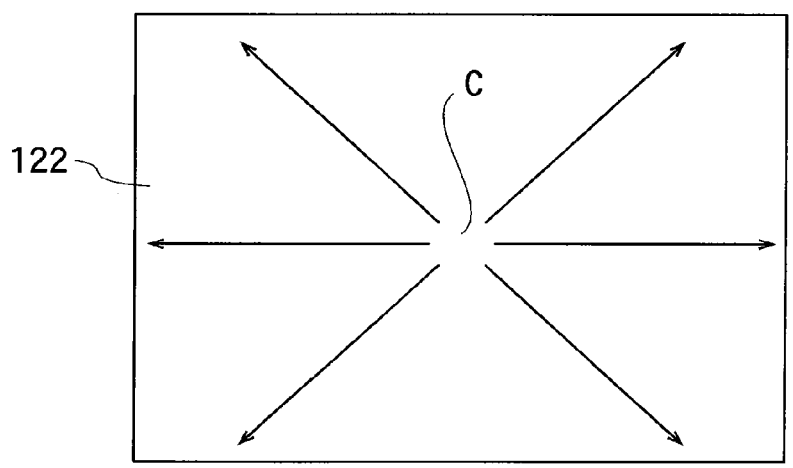
FIG. 15 is a plan view for illustrating extension of a pressing rubber.

The foregoing description relates to cases in which the first and third to fifth pressing rubbers 15, 65, 85, 95 are entirely surrounded by the dam members 16, 66, 86, 96, but the embodiments are not limited to such cases, and one or more slits 98 may be formed in the dam members 16, 66, 86, 96 so as to partially expose the side faces of the first and third to fifth pressing rubbers 15, 65, 85, 95 as shown in FIG. 13 so far as horizontal extension of the first and third to fifth pressing rubbers 15, 65, 85, 95 can be prevented.

The shape and size of the protective film 5 are not specifically limited, and if any contact can be avoided between the adhesive film 35 and the first to fifth pressing rubbers 15, 25, 65, 85, 95, a protective film 5 having a size that does not extend over the surface of the first to fifth pressing rubbers 15, 25, 65, 85, 95 may be used, or the protective film 5 covering only the partial surface of the object to be pressed 30 may be used.

If the adhesiveness between the adhesive film 35 and the first to fifth pressing rubbers 15, 25, 65, 85, 95 used is low, any one or more of the first to fifth pressing rubbers 15, 25, 65, 85, 95 may be brought into direct contact with the object to be pressed 30 without using the protective film 5.

As a method of decreasing the adhesiveness between the first to fifth pressing rubbers 15, 25, 65, 85, 95 and the adhesive film 35, the materials from which the first to fifth pressing rubbers 15, 25, 65, 85, 95 are formed may be changed to those having low adhesiveness to the adhesive film 35 or a release layer having releasability against the adhesive film 35 may be provided on the surfaces of the first to fifth pressing rubbers 15, 25, 65, 85, 95.

The location where the heating means is provided is not specifically limited, and it may be provided on either one or both of two pressing heads (first and second pressing heads 10, 20, first and third pressing heads 10, 60, or fourth and fifth pressing heads 80, 90) or provided on the platform 9 if it can transfer heat. Alternatively, the adhesive film 35 may be heated by external infrared radiation.

The adhesive film 35 may contain either one or both of a thermoplastic resin and a thermosetting resin.

The types of the thermosetting resin and thermoplastic resin are not specifically limited, but one or more thermosetting resins such as epoxy resins, acrylic resins and urethane resins and one or more thermoplastic resins such as phenoxy resins, polyvinyl alcohols can be used.

Instead of using the adhesive film 35, a pasty adhesive may be applied on the front face of the substrate 31 and then electric components may be bonded to the adhesive to form an object to be pressed 30.

Moreover, an adhesive film 35 having electrically conductive particles dispersed therein may be used and the electric components 32, 33 may be electrically connected to the substrate 31 by sandwiching the electrically conductive particles between connection terminals 37, 38 of the electric components 32, 33 and the connection terminal 37 of the substrate 31.

The type of the protective film is not specifically limited, but preferably has releasability against the adhesive film 35 described above, e.g., a formed film of polytetrafluoroethylene or a formed film of silicone rubber can be used.

The elastic materials forming the first to fifth pressing rubbers 15, 25, 65, 85, 95 are not specifically limited, but elastomers having rubber hardnesses (according to JIS S 6050) of 40, 80 could be used by way of example.

Rubber hardness is determined by the method described in "6. Test method" in JIS S 6050:2002, as follows.

Samples having stood for 24 hours or more after production are used for the test. General matters common to chemical analyses are as shown in JIS K 0050. A hardness tester is used in a test for hardness. The surface of a test sample piece horizontally held is brought into contact with the pressurizing face while the intender point of the tester is vertical. Then, the scale is immediately read as a positive number. As to the measurement point of the test sample piece, the entire surface of the test sample piece is divided into three, each center portion is measured individually, and then their median values become hardness of the test sample piece.

The hardness tester here refers to a spring hardness tester having a semi-circular indenter point of 5.08 mm±0.02 mm in diameter. The height of the indenter point is 2.54±0.22 mm at scale 0, and 0 mm at scale 100. The relationship between scale and spring force is shown in Table 1 below.

TABLE 1

Tab. 1 Relationship between scale and spring force

| Scale | 0 | 10 | 20 | 25 | 30 | 40 | 50 | 60 | 70 | 75 | 80 | 90 | 100 |
|---|---|---|---|---|---|---|---|---|---|---|---|---|---|
| Spring force N | 0.54 | 1.32 | 2.11 | 2.50 | 2.89 | 3.68 | 4.46 | 5.25 | 6.03 | 6.42 | 6.82 | 7.60 | 8.39 |

When elastomers having rubber hardnesses of 40, 60, 80 were measured for rubber hardness every 30° C. in the range of the measurement temperature of 30° C. to 240° C., the rubber hardness varied within ±2. It can be said that the rubber hardness is not influenced by temperature changes, because this value is within measurement error.

Elastomers used for the first to fifth pressing rubbers 15, 25, 65, 85, 95 may include both natural and synthetic rubbers, and preferably silicone rubber in terms of heat resistance and pressure resistance.

The first to fifth pressing rubbers 15, 25, 65, 85, 95 may be formed from the same material having the same rubber hardness or may be formed from different materials having different rubber hardnesses.

The type of the substrate 31 used in the embodiments is not specifically limited, either, and various substrates such as rigid substrates and flexible substrate can be used.

The types of the electric components 32, 33 to be connected to the substrate 31 are not specifically limited, and specifically include semiconductor elements, resistor elements, other substrates, etc.

Other electric components such as CR components may be connected to either one or both of the front face or the rear face of the substrate 31, before connecting the electric components 32, 33 to the front face and the rear face of the substrate 31, while starting connecting the electric components 32, 33 to the rear face of the substrate 31 after connecting the electric components 32, 33 to the front face of the substrate 31, or after connecting the electric components 32, 33 to both of the front face and the rear face of the substrate 31.

It should be understood that various changes and modifications to the presently preferred embodiments described herein will be apparent to those skilled in the art. Such changes and modifications can be made without departing from the spirit and scope of the present invention and without diminishing its intended advantages. It is therefore intended that such changes and modifications be covered by the appended claims.

The invention is claimed as follows:

1. A method for packaging electric components on a substrate comprising:
   provisionally bonding each component to both a front face and a rear face of a substrate, respectively, by an adhesive film so as to constitute an object to be pressed;
   interposing the object to be pressed with two pressing rubbers;
   surrounding outer peripheries of the two pressing rubbers and an outer periphery of the object to be pressed by a dam member;
   pressing the object to be pressed by the two pressing rubbers, while heating the electric components, in a state that bulges of the two pressing rubbers is stopped by the dam member;
   fixing the electric components to the both sides of the substrate, respectively;
   placing protective films, which are deformable and releasable from the adhesive film, between one of the pressing rubbers and the object to be pressed and between other of the pressing rubbers and the object to be pressed, respectively, to interpose the object to be pressed with the two pressing rubbers; and
   pressing the two pressing rubbers towards the object to be pressed via the protective films.

2. The method for packaging electric components on a substrate according to claim 1, wherein a film having electrically conductive particles dispersed therein is used as the adhesive film.

3. The method for packing electric components on a substrate according to claim 1, wherein at least one of the pressing rubbers is placed on a compressively deformable compression member provided on a pressing plate, the pressing rubber on the compression member is surrounded by the dam member, when the object to be pressed is pressed by the two pressing rubbers, the dam member becomes higher than the surface level of the pressing rubber on the compression member by compressing the compression member, and the other pressing rubber is inserted into a part surrounded by the dam member.

* * * * *